United States Patent
Shong et al.

(10) Patent No.: US 6,835,594 B2
(45) Date of Patent: Dec. 28, 2004

(54) METAL WIRING METHOD FOR AN UNDERCUT

(75) Inventors: Ci-moo Shong, Sungnam-si (KR);
Seok-jin Kang, Suwon-si (KR);
Seok-whan Chung, Suwon-si (KR);
Moon-chul Lee, Sungnam-si (KR);
Kyu-dong Jung, Suwon-si (KR);
Jong-seok Kim, Gyeonggi-do (KR);
Chan-bong Jun, Seoul (KR); Seog-woo Hong, Busan (KR); Jung-ho Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/686,769

(22) Filed: Oct. 17, 2003

(65) Prior Publication Data

US 2004/0203186 A1 Oct. 14, 2004

(30) Foreign Application Priority Data

Oct. 17, 2002 (KR) .................................. 10-2002-0063608

(51) Int. Cl.$^7$ .................. H01L 21/44; H01L 21/48; H01I 21/50

(52) U.S. Cl. .................. 438/106; 438/311; 438/506
(58) Field of Search .................. 438/106, 51, 55, 438/64, 311, 460, 488, 489, 506, 513, 514, 739

(56) References Cited

U.S. PATENT DOCUMENTS

| | | | | |
|---|---|---|---|---|
| 5,198,390 A | * | 3/1993 | MacDonald et al. | 438/52 |
| 5,363,021 A | * | 11/1994 | MacDonald | 315/366 |
| 5,468,595 A | * | 11/1995 | Livesay | 430/296 |
| 6,566,274 B1 | * | 5/2003 | Jacot et al. | 438/739 |

* cited by examiner

*Primary Examiner*—David Nhu
(74) *Attorney, Agent, or Firm*—Lee & Sterba, P.C.

(57) ABSTRACT

A metal wiring method for an undercut in a MEMS packaging process includes disposing a MEMS element on a silicon substrate, welding a glass wafer to an upper portion of the silicon substrate having the MEMS element disposed thereon, the glass wafer having a hole formed therein for connecting a metal wiring, depositing a thin metal film for the metal wiring in the hole, and ion-mealing the deposited thin metal film. By the ion-mealing, the method is capable of connecting a metal wiring to a via hole having an undercut.

5 Claims, 6 Drawing Sheets

METAL WIRING METHOD FOR AN UNDERCUT

BACKGROUND OF THE INVENTION

1. Field of the Invention

The present invention relates to MEMS (Micro-Electronic Mechanical System) technology. More particularly, the present invention relates to a metal wiring method capable of connecting a metal wiring to a via hole having an undercut.

2. Description of the Related Art

A prospect of MEMS Market development shows rapid growth in that MEMS technology adopts semiconductor manufacturing techniques, thereby realizing bioengineering related technology and products such as protein chips, DNA chips and micro machining, which are nano-meter level microminiature three-dimensional precision machinery structures.

MEMS technology adopts semiconductor fine manufacturing techniques, which repeat steps such as vapor deposition and etching, thereby enabling mass production of microminiature products at low prices. MEMS technology also uses electrostatic force, which is an attraction between charges, and surface tension as a driving force to generate current, thereby greatly lowering power consumption. The importance of MEMS technology grows as nano-technology and System On Chip (SOC) technology are developed.

Since a MEMS element may be easily broken, MEMS elements are tightly packaged or, more preferably, hermetically sealed, in order to be protected from dangerous circumstances.

A MEMS element packaged in this way may be referred to as a MEMS.

FIG. 1 illustrates a cross sectional view of a MEMS element 13 welded to a silicon wafer or substrate 12 and a glass wafer 14 according to the prior art.

Referring to FIG. 1, the MEMS element 13 is layered on the silicon substrate 12, and the glass wafer 14 is welded onto the silicon substrate 12 having the MEMS element 13 layered thereon.

A gyro chip, for example, may be used for the MEMS element 13, and an SOI (Silicon On Insulator) wafer may be used for the silicon substrate 12.

The silicon substrate 12 and the glass wafer 14 are welded using an anodic bonding technique, enabling hermetically sealed packaging when adapted to the MEMS element 13.

To connect wiring to the SOI wafer or silicon substrate 12, a glass wafer 14 having a via hole therein is used. A problem arises, however, when a via hole is bored into the glass wafer 14. Namely, an undercut 15 is formed on the glass wafer 14 when the via hole is bored therethrough. Evidence that such an undercut is formed may be seen in FIG. 2, which shows a Scanning Electron Microscopy (SEM) photograph of portion A of FIG. 1. In FIG. 2, undercuts may be easily seen around the via hole.

Undercuts such as these may cause a disconnection of metal wiring of the MEMS element or an increase in resistance and a decrease in yield of the device.

A method has been suggested for overcoming the undercut problem that uses a technique for boring via holes partially into a glass wafer using an etching solution, so that the via holes are not bored completely through the glass wafer. However, although the technique does not generate an undercut, some portions of the glass wafer have holes bored therein while other portions do not, and a manufacturing process becomes very complicated. Further, malformed holes may be formed, resulting in decreased yield of devices.

A manufacturing process becomes very simple if via holes are bored completely through the glass wafers. However, in such a case, excessive vapor deposition of a thin metal film for wiring is necessary, and the wiring may still be disconnected, or a yield of devices may be decreased.

SUMMARY OF THE INVENTION

In an effort to solve these and other problems, it is a feature of an embodiment of the present invention to provide a wiring method that allows a metal wiring to be connected to a glass wafer having an undercut formed therein.

According to a feature of an embodiment of the present invention, there is provided a metal wiring method for an undercut in a MEMS packaging process, the method including, disposing a MEMS element on a silicon substrate, welding a glass wafer to an upper portion of the silicon substrate having the MEMS element disposed thereon, the glass wafer having a hole formed therein for connecting a metal wiring, depositing a thin metal film for the metal wiring in the hole, and ion-mealing the deposited thin metal film.

In the ion-mealing of the method described above, the deposited thin metal film may be resputtered by injecting accelerated gas particles to strike the deposited thin metal film. Further, if the glass wafer has an undercut formed around the hole formed therein, the undercut is filled with the resputtered thin metal film. Further still, if the glass wafer has an undercut formed around the hole formed therein, the ion-mealing may be performed until the undercut is removed. The accelerated gas particles are preferably argon gas particles.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
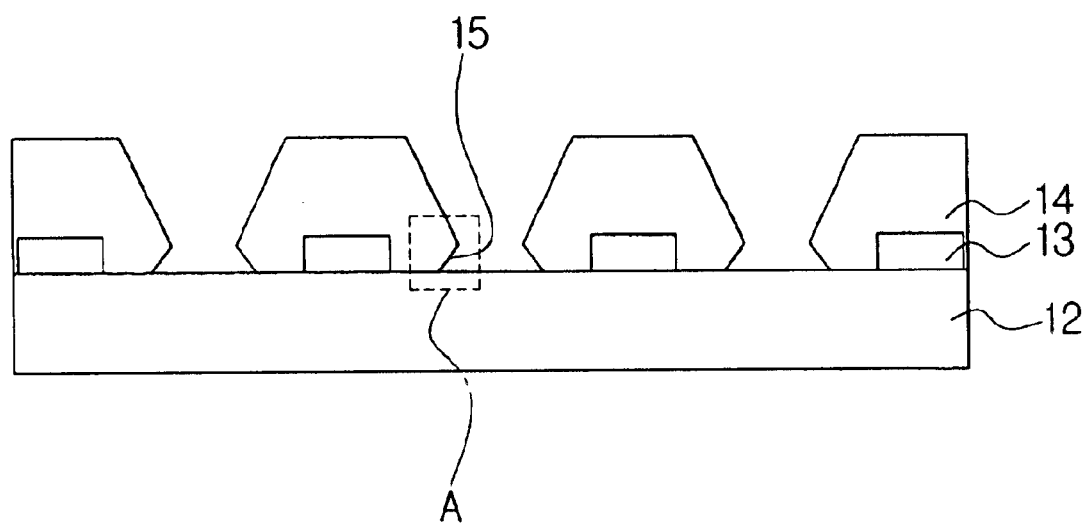
FIG. 1 illustrates a cross sectional view of a MEMS element welded to a silicon wafer and a glass wafer.
Figure 2:
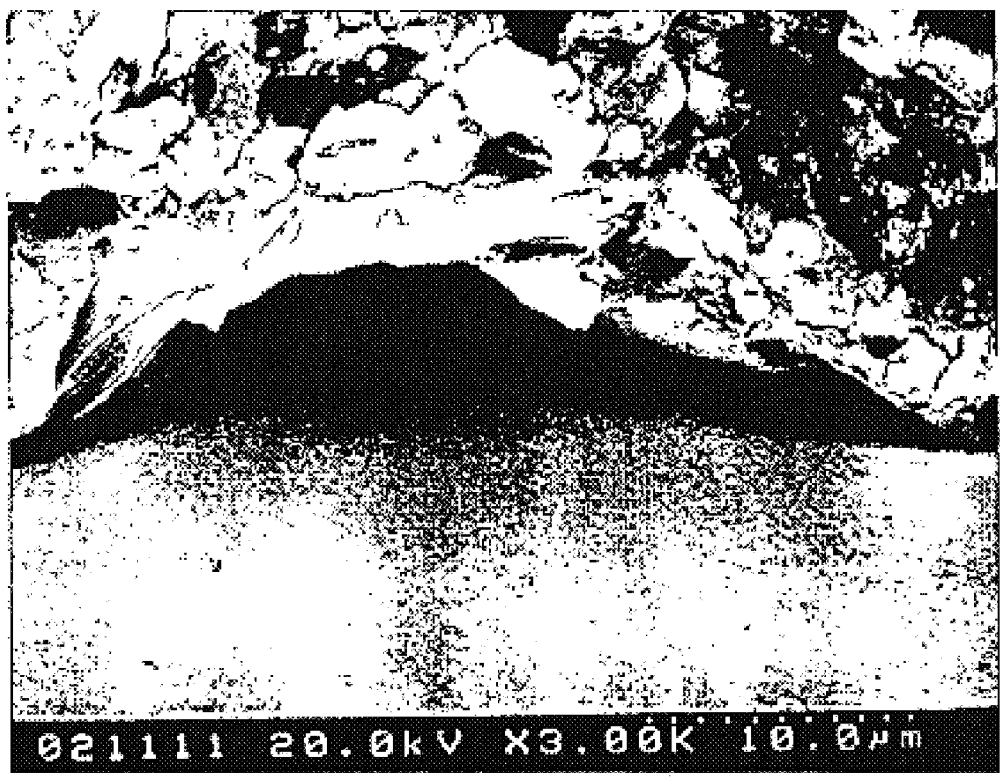
FIG. 2 is a SEM photograph of a portion A of FIG. 1.

Korean Patent Application No. 2002-63608, filed on Sep. 17, 2002, and entitled: "Metal Wiring Method For Undercut," is incorporated by reference herein in its entirety The present invention will be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 3:
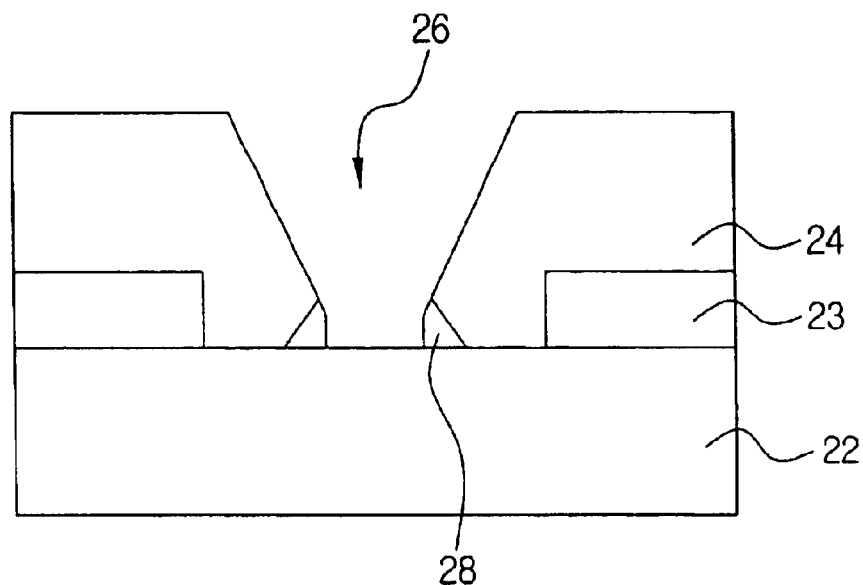
FIG. 3 illustrates a cross sectional view of a MEMS element welded to a silicon wafer and a glass wafer in accordance with the present invention.

FIG. 3 illustrates a view of a MEMS element welded to a silicon substrate or wafer and a glass wafer in an early stage of a packaging process of the MEMS element.

Referring to FIG. 3, a MEMS element 23 is welded to a silicon substrate 22, and a glass wafer 24 is welded to an upper portion of the silicon substrate 22, on which the MEMS element 23 is welded. In an alternate embodiment of the present invention, a silicon wafer may be used in place of the glass wafer 24. The silicon substrate 22 may be formed of single-crystalline silicon, polycrystalline silicon, amorphous silicon or a SOI wafer.

The MEMS element 23 and silicon substrate 22 are connected using a wiring (not shown).

For the wiring, a via hole 26 is bored through the glass wafer 24 prior to the glass wafer 24 being welded to the silicon substrate 22. Here, an undercut 28 is formed on a portion of the glass wafer 24 adjacent to a bottom of the via hole 26. Then the glass wafer 24 is welded to the silicon substrate 22 having the MEMS element 23 welded thereon. As described above, the undercut 28 may cause a disconnection in a wiring to be added later, or an increase in resistance and decrease in device yield.

In accordance with another embodiment of the present invention, instead of boring the via hole 26 through the glass wafer 24 prior to welding the glass wafer 24 to the silicon substrate 22, a via hole may be bored into a boundary of a silicon substrate and a glass wafer after the glass wafer and the silicon substrate have been welded together.

To electrically connect the MEMS element 23 with the silicon substrate 22, various wiring methods may be used. A specific wiring method of depositing and shaping metal on a structure may be adapted for use in the present invention. In an embodiment of the present invention, aluminum is used for deposition of the wiring.

Figure 4:
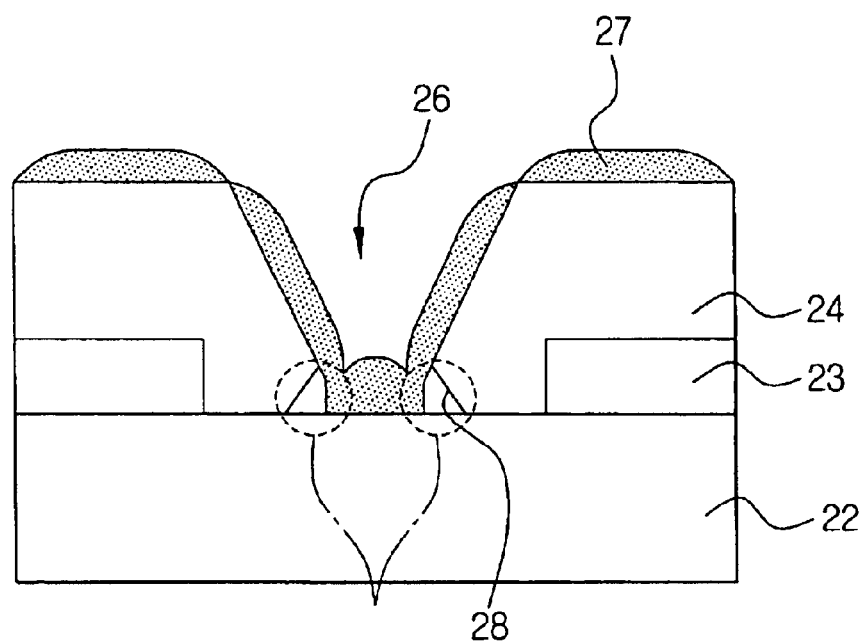
FIG. 4 illustrates a cross sectional view of a MEMS package of FIG. 3 on which aluminum is deposited.

FIG. 4 illustrates a cross sectional view of the MEMS package of FIG. 3 having aluminum 27 deposited thereon. As shown in FIG. 4, the aluminum 27 is not deposited in the undercuts 28 of the via hole 26 in the glass wafer 24. Therefore, a disconnection of metal wiring occurs at the undercuts 28 where the aluminum 27 is not deposited.

Figure 5:
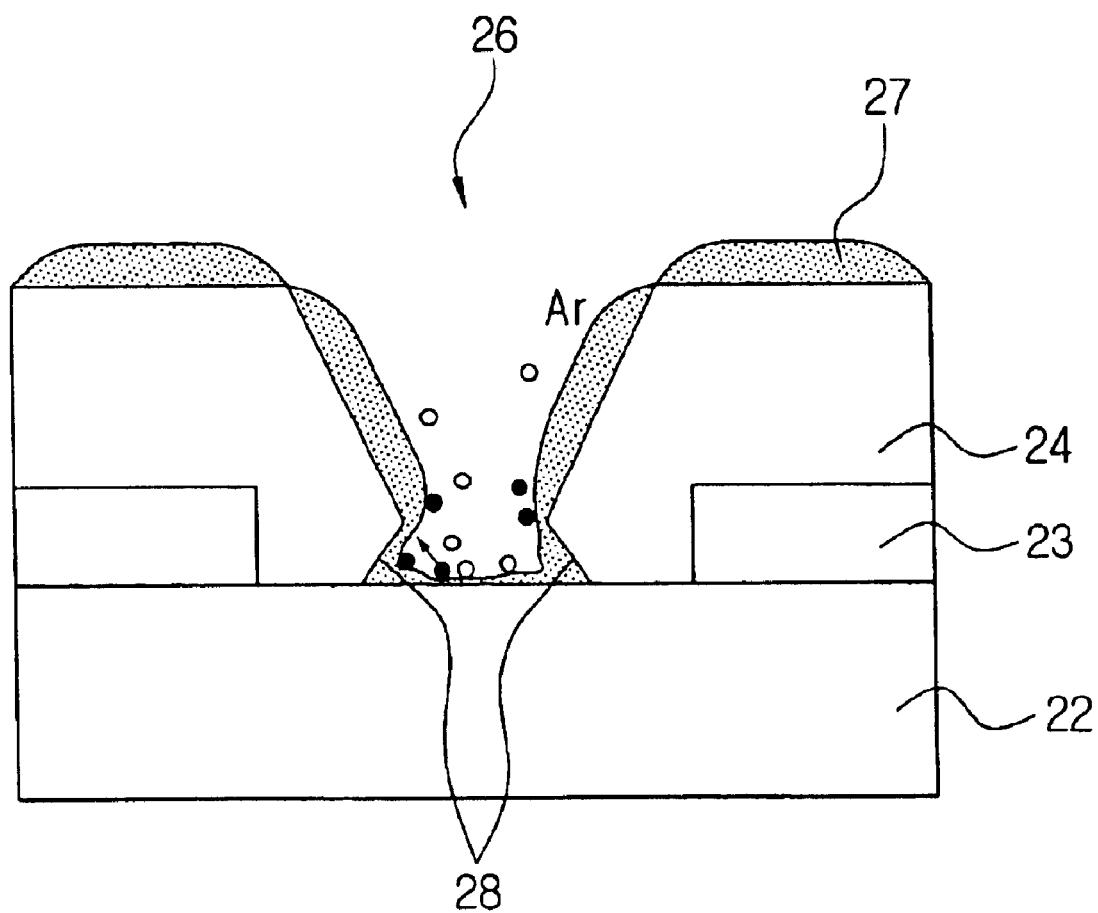
FIG. 5 illustrates a view of the MEMS package of FIG. 4, showing a mealing process of the deposited aluminum by using an ion-mealing device.

To resolve this problem, an embodiment of the present invention provides for ion-mealing of the deposited aluminum, as illustrated in FIG. 5.

FIG. 5 illustrates a view of the MEMS package of FIG. 4, showing a mealing process of the deposited aluminum by an ion-mealing device (not shown).

As shown in FIG. 5, when the ion-mealing device (not shown) is used for mealing the aluminum 27, argon (Ar) particles having strong energy due to a thermoelectric effect resputter and reflow aluminum particles at a bottom of the via hole 26 adjacent to the undercuts 28.

After aluminum 27 is deposited to a thickness of about 5 $\mu$m, a mealing processing time varies according to a kind of ion-mealing device and power used. However, it is preferable for the mealing processing time to be from about 30 minutes to about one hour.

In the mealing process, the argon (Ar) particles fall almost vertically, so that the aluminum particles at the bottom of the via hole 26 are etched gradually toward the undercuts 28. As a result, the mealed aluminum fills up the undercut portions, and thus the undercuts 28 are removed.

Figure 6:
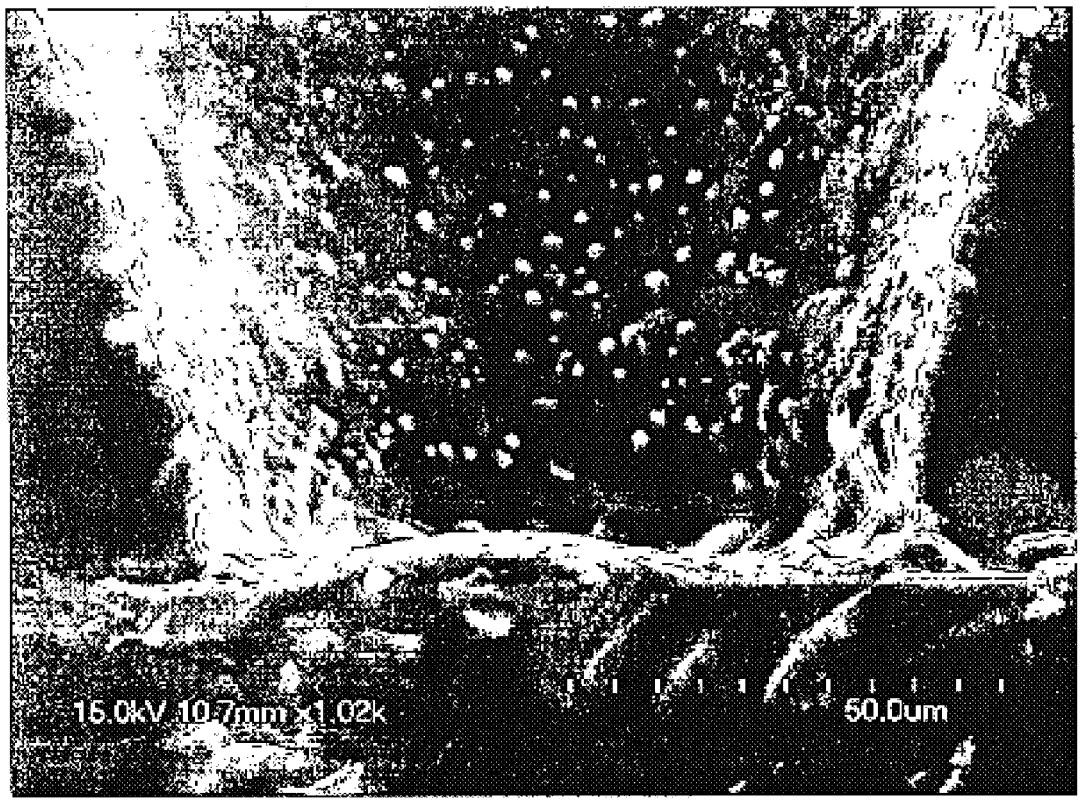
FIG. 6 is an SEM photograph of a MEMS package having aluminum deposited thereon, and the deposited aluminum being mealed, in accordance with the present invention.

FIG. 6 is an SEM photograph of a MEMS package having aluminum deposited thereon, and the deposited aluminum being mealed. It may be seen from FIG. 6 that mealing the aluminum results in undercut portions being resputtered by the aluminum, so that the aluminum is deposited in the undercuts. Therefore, disconnection of the metal wiring at the undercut portions is prevented.

Figure 7:
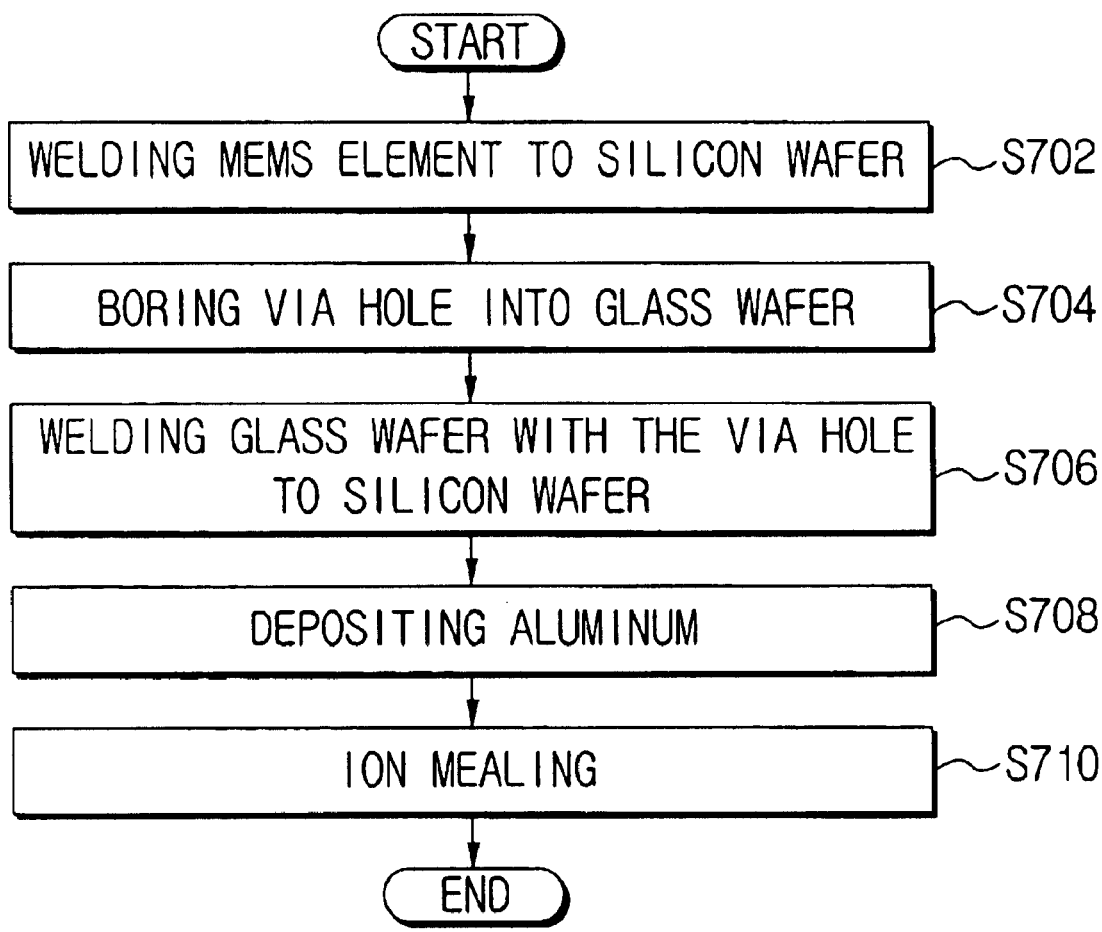
FIG. 7 is a flow chart illustrating a wiring method capable of removing undercuts according to an embodiment of the present invention.

A wiring method capable of removing undercuts according to an embodiment of the present invention will be described hereinafter with reference to the flow chart of FIG. 7.

First, a MEMS element is welded to a silicon wafer (S702). Next, a via hole is bored through a glass wafer to be welded to the silicon wafer having the MEMS element welded thereto (S704). Then, the glass wafer with the via hole bored therethrough is welded to the silicon wafer (S706).

For metal wiring, aluminum is deposited onto the welded glass wafer and the silicon wafer using an aluminum sputter process (S708). The aluminum deposited to the MEMS package is mealed using an ion-mealing device (S710).

The process described above may be used for all manufacturing processes for wafer level packaging using glass wafers.

With the present invention, it is possible to connect metal wiring to via holes having undercuts by using an ion-mealing device, so that electrical disconnection of the metal wiring due to the undercuts is prevented. Also, since via holes are etched through a glass wafer in the present invention, the manufacturing process for boring the via holes of the present invention is very simple compared with a method using an etching solution to bore via holes. Further, yield can be greatly increased by the method of the present invention compared with existing metal wiring processes.

Preferred embodiments of the present invention have been disclosed herein and, although specific terms are employed, they are used and are to be interpreted in a generic and descriptive sense only and not for purpose of limitation. For example, the present invention may be readily applied to other types of apparatuses. Accordingly, it will be understood by those of ordinary skill in the art that various changes in form and details may be made without departing from the spirit and scope of the present invention as set forth in the following claims, in which means-plus-function clauses are intended to cover the structures described herein as performing the recited function and not only structural equivalents but also equivalent structures.

What is claimed is:

1. A metal wiring method for an undercut in a MEMS packaging process, the method comprising:

disposing a MEMS element on a silicon substrate;

welding a glass wafer to an upper portion of the silicon substrate having the MEMS element disposed thereon, the glass wafer having a hole formed therein for connecting a metal wiring;

depositing a thin metal film for the metal wiring in the hole; and ion-mealing the deposited thin metal film.

2. The method as claimed in claim 1, wherein in the ion-mealing, the deposited thin metal film is resputtered by injecting accelerated gas particles to strike the deposited thin metal film.

3. The method as claimed in claim 2, wherein if the glass wafer has an undercut formed around the hole formed therein, the undercut is filled with the resputtered thin metal film.

4. The method as claimed in claim 3, wherein when the glass wafer has the undercut formed around the hole formed therein, the ion-mealing is performed until the undercut is removed.

5. The method as claimed in claim 2, wherein the accelerated gas particles are argon gas particles.

* * * * *